United States Patent
Takesako et al.

(10) Patent No.: US 8,956,961 B2
(45) Date of Patent: Feb. 17, 2015

(54) SEMICONDUCTOR DEVICE AND METHOD FOR MAKING THE SAME

(75) Inventors: Kazuaki Takesako, Taichung (TW);
Wen-Kuei Hsu, Taichung (TW);
Yoshinori Tanaka, Taichung (TW);
Yukihiro Nagai, Taichung (TW);
Chih-Wei Hsiung, Taichung (TW);
Hirotake Fujita, Taichung (TW);
Tomohiro Kadoya, Taichung (TW);
Wei-Chih Liu, Taichung (TW);
Hsuan-Yu Fang, Taichung (TW);
Yu-Ling Huang, Taichung (TW);
Meng-Hsien Chen, Taichung (TW);
Chun-Chiao Tseng, Taichung (TW);
Chung-Yung Ai, Taichung (TW);
Yu-Shan Hsu, Taichung (TW); Wei-Che Chang, Taichung (TW); Chun-Hua Huang, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 487 days.

(21) Appl. No.: 13/415,959

(22) Filed: Mar. 9, 2012

(65) Prior Publication Data

US 2013/0234230 A1  Sep. 12, 2013

(51) Int. Cl.
*H01L 21/02* (2006.01)

(52) U.S. Cl.
USPC ........... 438/515; 438/630; 438/647; 438/243; 257/E21.144

(58) Field of Classification Search
USPC ........... 438/914, 630, 647, 243; 257/E21.144
See application file for complete search history.

(56) References Cited

U.S. PATENT DOCUMENTS

2004/0046200 A1* 3/2004 Wu .............................. 257/301

* cited by examiner

*Primary Examiner* — Minchul Yang
(74) *Attorney, Agent, or Firm* — Occhiuti & Rohlicek LLP (57) ABSTRACT

A semiconductor device includes: a substrate having a base and an array of semiconductor pillars extending from the base, the substrate being formed with a plurality of trenches, each of which extends into the base and has two opposing trench side walls; a first insulative liner layer formed on each of the trench side walls of each of the trenches and divided into upper and lower segments by a gap that leaves a bit-forming surface of each of the trench side walls uncovered by the first insulative liner layer; and a plurality of buried bit lines, each of which extends into the base from the bit-forming surface of a respective one of the trench side walls of each of the trenches.

14 Claims, 12 Drawing Sheets

SEMICONDUCTOR DEVICE AND METHOD FOR MAKING THE SAME

BACKGROUND OF THE INVENTION

1. Field of the Invention

This invention relates to a semiconductor device and a method for making the same, more particularly to a semiconductor device and a method involving formation of diffusion buried bit lines in a base of a substrate.

2. Description of the Related Art

Dynamic random access memory (DRAM) device is a volatile memory device for storing data or information, and includes an array of transistors and capacitors, bit lines electrically coupled to sources or drains of the transistors, and word lines electrically coupled to gates of the transistors. Development of the DRAM devices in the DRAM industry has been focused on how to increase the storage capacity thereof. One way of increasing the storage capacity is accomplished by forming deep trenches in a Si substrate and buried bit lines in side walls of the trenches. The smaller the width of the trenches, the higher will be the storage capacity. However, to reduce the width of the trenches from the current DRAM generation (the width of the trench being about 60 nm) to the next DRAM generation (the width of the trench being about 20-40 nm) can be a great challenge.

FIGS. 1A to 1F illustrate consecutive steps of a conventional method of forming buried bit lines inside walls of trenches in a semiconductor substrate for making a vertical transistor DRAM device. Each of the buried bit lines is adapted to be electrically coupled to a source or a drain of a transistor formed in the semiconductor substrate. The method includes: forming a patterned hard mask 93 on a semiconductor substrate 92 so that the substrate 92 has predetermined regions 922 not covered by the patterned hard mask 93 (see FIG. 1A); etching the substrate 92 at the predetermined regions 922 not covered by the hard mask 93 so as to form a plurality of trenches 94 in the substrate 92 (see FIG. 1B); forming a liner layer 95 on trench side walls 941 and a bottom wall 942 of each of the trenches 94 (see FIG. 1C); removing a bottom of the liner layer 95 to uncover the bottom wall 942 of each trench 94 by dry etching (see FIG. 1D); ion implanting a dopant into the substrate 92 at the bottom wall 942 of each trench 94 by ion implantation techniques so as to form a doped region 96 at the bottom wall 942 of each trench 94 (see FIG. 1E); and deepening each of the trenches 94 by dry etching in order to cut the doped region 96 into two separate halves that form two separated buried bit lines 961 in the trench side walls 941 of each trench 94, respectively (see FIG. 1F).

Figure 1A:
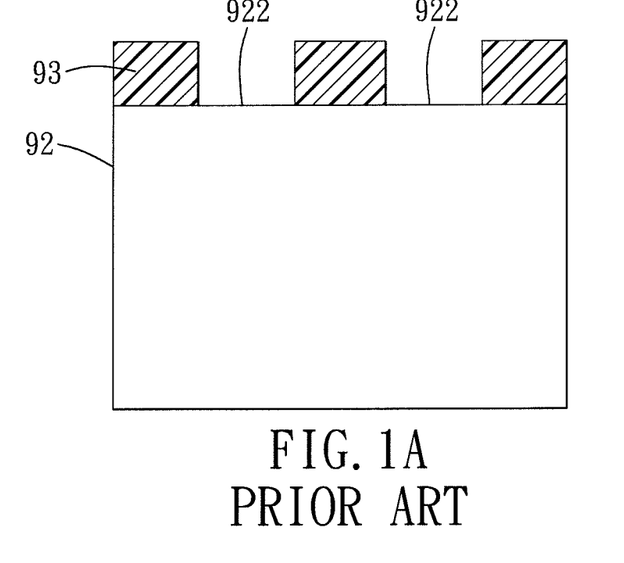
FIGS. 1A to 1F are schematic views illustrating consecutive steps of a conventional method of making a semiconductor device.
Figure 1B:
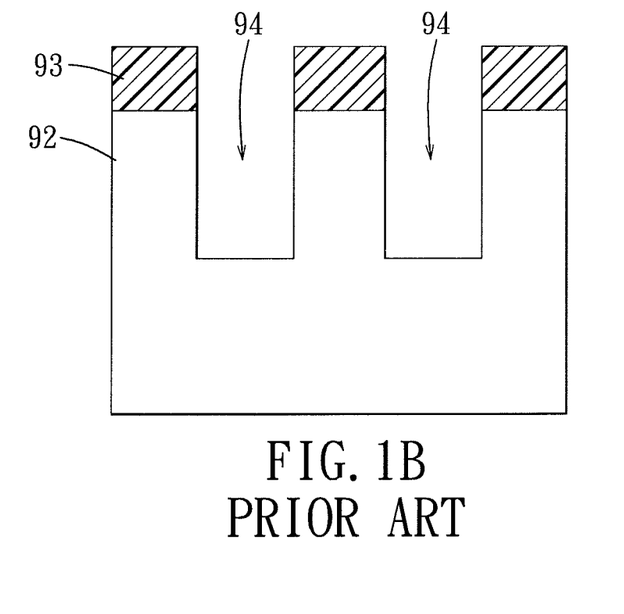
Figure 1C:
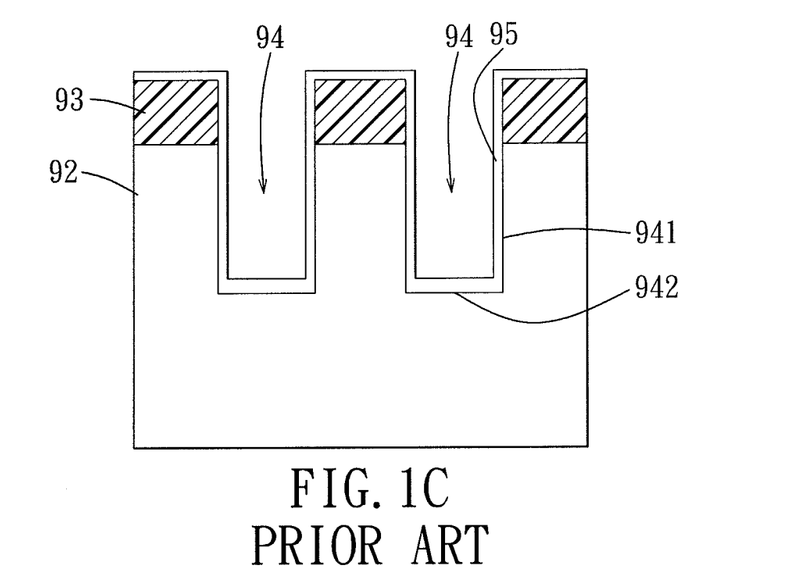
Figure 1D:
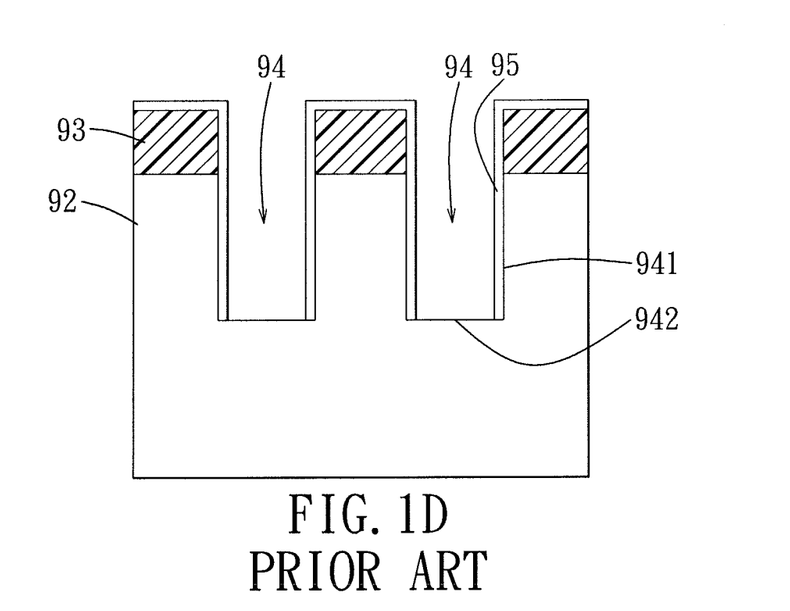
Figure 1E:
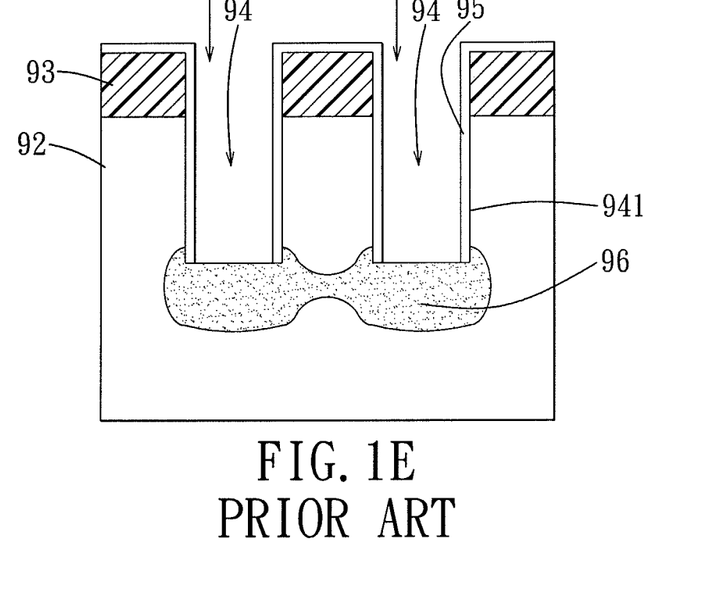
Figure 1F:
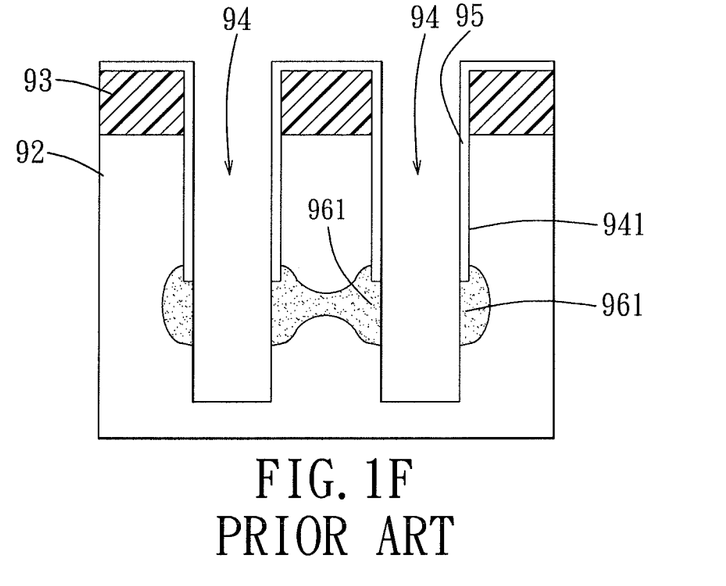

The conventional method is disadvantageous in that the liner layer 95 is required to have a thickness (at least 10 nm thick) sufficient to prevent scattering of implantation ions or dopant into the trench side walls 941 of the trenches 94. As such, the liner layer 95 considerably reduces the space of each trench 94 available for ion implantation and for trench deepening, which results in difficulty in performing the ion implantation and the trench deepening. In addition, since the doped region 96 thus formed is relatively thick in the depth direction, each trench 94 is required to be deepened an extra depth (e.g., about 200 nm) that is greater than the thickness of the doped region 96 in the depth direction so as ensure the doped region 96 is cut through to form the two separated buried bit lines 961. The extra deepening of each trench 94 is very difficult to perform in view of a narrow space in the trench 94.

SUMMARY OF THE INVENTION

Therefore, an object of the present invention is to provide a semiconductor device and a method for making the same that can overcome the aforesaid drawbacks associated with the prior art.

According to one aspect of the present invention, there is provided a semiconductor device that comprises: a substrate having a base and an array of semiconductor pillars extending upwardly from the base and arranged in rows, the substrate being formed with a plurality of trenches, each of which is disposed between two adjacent rows of the semiconductor pillars, extends into the base, and has two opposing trench side walls extending from top ends of the two adjacent rows of the semiconductor pillars; a first insulative liner layer formed on each of the trench side walls of each of the trenches and divided into upper and lower segments by a gap that leaves a bit-forming surface of each of the trench side walls uncovered by the first insulative liner layer; and a plurality of buried bit lines, each of which extends into the base from the bit-forming surface of a respective one of the trench side walls of each of the trenches, and each of which is electrically coupled to an aligned one of the rows of the semiconductor pillars.

According to another aspect of the present invention, there is provided a method for making a semiconductor device. The method comprises: (a) forming a plurality of trenches in a substrate; (b) forming a first insulative liner layer on two opposing trench side walls of each of the trenches; (c) partially covering the first insulative liner layer with a bit-controlling material such that only an upper segment of the first insulative liner layer on each of the trench side walls is uncovered by the bit-controlling material; (d) forming a second insulative liner layer on the upper segment of the first insulative liner layer on each of the trench side walls, the second insulative liner layer being made from a material different from those of the first insulative liner layer and the bit-controlling material; (e) removing a top portion of the bit-controlling material and an intermediate segment of the first insulative liner layer that is covered by the top portion of the bit-controlling material so as to uncover a bit-forming surface of each of the trench side walls; and (f) diffusing a dopant into the substrate through the bit-forming surface to form a buried bit line that extends inwardly from the bit-forming surface into each of the trench side walls.

BRIEF DESCRIPTION OF THE DRAWINGS

In drawings which illustrate embodiments of the invention.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Figure 2:
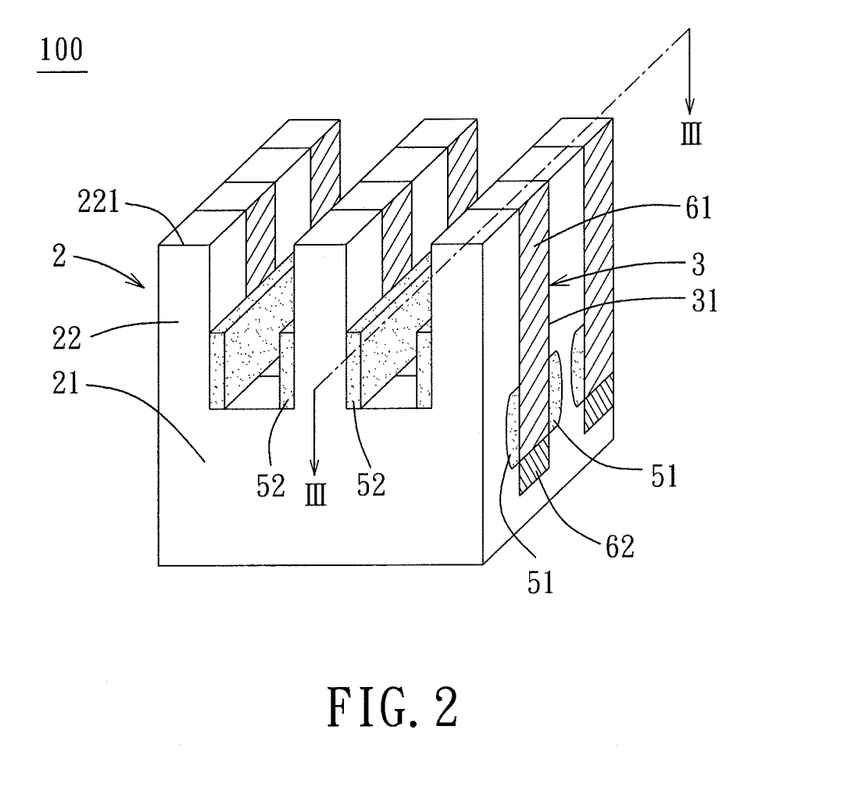
FIG. 2 is a perspective view of the first preferred embodiment of a semiconductor device according to the present invention.
Figure 3:
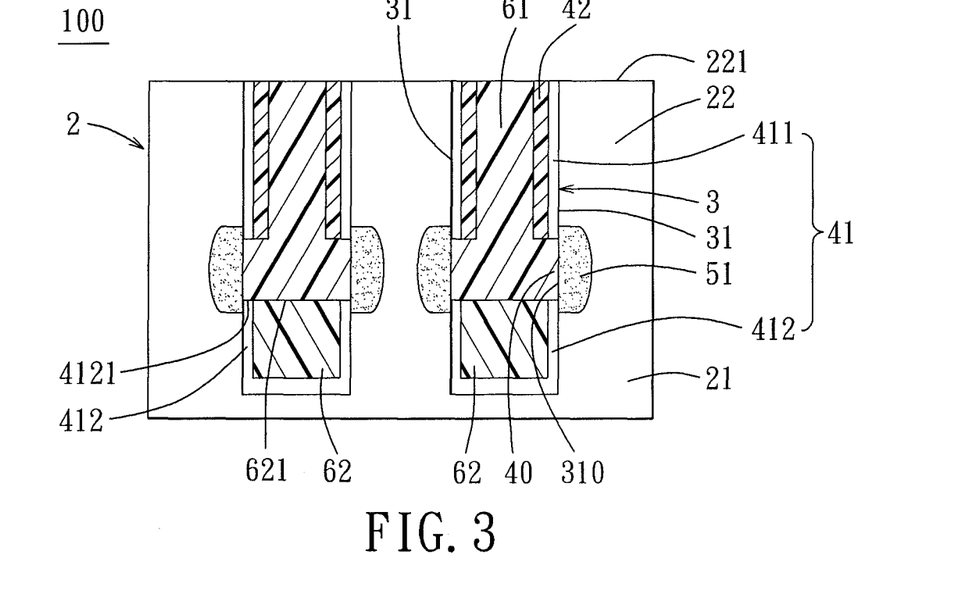
FIG. 3 is a sectional view taken along line III-III in FIG. 2.

FIGS. 2 and 3 illustrate the first preferred embodiment of a semiconductor device 100 that can be processed to form semiconductor memory cells, such as vertical transistor type DRAM cells, according to the present invention.

The semiconductor device 100 includes: a substrate 2 having a base 21 and an array of semiconductor pillars 22 extending upwardly from the base 21 and arranged in rows, the substrate 2 being formed with a plurality of trenches 3, each of which is disposed between two adjacent rows of the semiconductor pillars 22, extends into the base 21, and has two opposing trench side walls 31 extending from top ends 221 of the two adjacent rows of the semiconductor pillars 22; a first insulative liner layer 41 formed on each of the trench side walls 31 of each of the trenches 3 and divided into upper and lower segments 411, 412 by a gap 40 that leaves a bit-forming surface 310 of each of the trench side walls 31 uncovered by the first insulative liner layer 41; a plurality of buried bit lines 51, each of which extends into the base 21 from the bit-forming surface 310 of a respective one of the trench side walls 31 of each of the trenches 3, and each of which is electrically coupled to an aligned one of the rows of the semiconductor pillars 22; a second insulative liner layer 42 formed on the upper segment 411 of the first insulative liner layer 41, the first and second insulative liner layers 41, 42 being made from different materials; an insulative isolation material 61 disposed in each of the trenches 3 and extending into the gap 40 so as to cover the second insulative liner layer 42 and the bit-forming surface 310 of each of the trench side walls 31 of each of the trenches 3; and a bit-controlling material 62 disposed in each of the trenches 3 below the insulative isolation material 61 and covering the lower segment 412 of the first insulative liner layer 41. The second insulative liner layer 42 is made from a material different from the bit-controlling material 62. The lower segment 412 of the first insulative liner layer 41 has a top end 4121. The bit-controlling material 62 has a top end 621 substantially flush with the top end 4121 of the lower segment 412 of the first insulative liner layer 41.

Each of the pillars 22 has a source region or a drain region and a conduction channel region (not shown). A plurality of word lines 52 are disposed among columns of the pillars 22. Each of the word lines 52 is electrically coupled to the channel regions of an adjacent one of the columns of the pillars 22, and extends in a transverse direction relative to the buried bit lines 51. A plurality of capacitors (not shown) are formed on the pillars 22, respectively.

Preferably, the substrate 2 is a dopant-doped silicon wafer.

Figure 4:
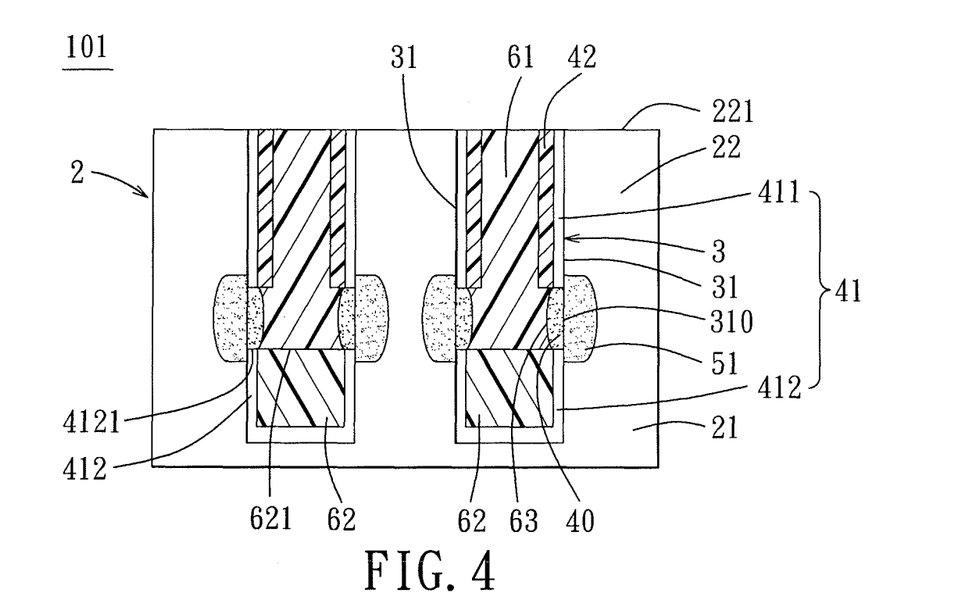
FIG. 4 is a sectional view of the second preferred embodiment of a semiconductor device according to the present invention.

FIG. 4 illustrates the second preferred embodiment of the semiconductor device 101 according to the present invention. The second preferred embodiment differs from the previous embodiment in that the semiconductor device 101 further includes a conductive silicide layer 63 formed on the bit-forming surface 310 of each of the trench side walls 31 and filling the gap 40. The insulative isolation material 61 covers the conductive silicide layer 63. The conductive silicide layer 63 is made from a silicide of a refractory metal. The refractory metal is selected from titanium, tungsten, nickel and cobalt.

FIGS. 5A to 5L illustrate consecutive steps of the preferred embodiment of a method of making the semiconductor device according to the present invention.

The method includes the steps of: forming a hard mask layer 7 on a substrate 2 (see FIG. 5A); patterning the hard mask layer 7 by dry etching so as to expose a plurality of etching regions 24 of the substrate 2 (see FIG. 5B); dry etching the etching regions 24 of the substrate 2 so as to form a plurality of trenches 3 in the substrate 2 (see FIG. 5C); forming a first insulative liner layer 41 on two opposing trench side walls 31 and a bottom wall 32 of each of the trenches 3 by oxidation or vapor deposition (see FIG. 5D); filling each of the trenches 3 with a bit-controlling material 62 by vapor deposition or coating to cover entirely the first insulative liner layer 41 in each trench 3 (see FIG. 5E); removing an upper portion of the bit-controlling material 62 by wet etching or dry etching or by exposure and development when photoresist is used as the bit-controlling material 62 so as to partially cover the first insulative liner layer 41 such that only an upper segment 411 of the first insulative liner layer 41 on each of the trench side walls 31 is uncovered by the bit-controlling material 62 (see FIG. 5F); forming a second insulative liner layer 42 on the upper segment 411 of the first insulative liner layer 41 on each of the trench side walls 31 and on a top end of the bit-controlling material 62 by vapor deposition, the second insulative liner layer 42 being made from a material different from those of the first insulative liner layer 41 and the bit-controlling material 62 (see FIG. 5G); removing a bottom portion of the second insulative liner layer 42 as well as top ends of the first and second liner layers 41, 42 by dry etching so that removal of the bottom portion of the second insulative liner layer 42 results in exposure of the top end of the bit-controlling material 62 in each of the trenches (see FIG. 5H); removing a top portion of the bit-controlling material 62 that covers an intermediate segment 413 of the first insulative liner layer 41 by dry plasma ashing when photoresist is used as the bit-controlling material 62 so that the intermediate segment 413 of the first insulative liner layer 41 is uncovered (see FIG. 5I); removing the intermediate segment 413 of the first insulative liner layer 41 by dry etching or wet etching so as to form a gap 40 that divides the first insulative liner layer 41 into the upper segment 411 and a lower segment 412 and to uncover a bit-forming surface 310 of each of the trench side walls 31 (see FIG. 5J); diffusing a dopant into the substrate 2 through the bit-forming surface 310 to form a diffusion buried bit line 51 that extends inwardly from the bit-forming surface 310 into each of the trench side walls 31 (see FIG. 5K); filling an insulative isolation material 61 in each of the trenches 3 to fill the gap 40 and to cover the bit-forming surface 310 of each of the trench side walls 31 after formation of the diffusion buried bit lines 51 (see FIG. 5L); and removing the hard mask 7, top ends of the first and second insulative liner layers 41, 42 and a top end of the insulative isolation material 61 (see FIG. 3) by wet etching using $H_3PO_4$ or HF etchant solution depending on the material to be removed. The semiconductor device 100 thus formed can be further processed to form conductive word lines and capacitors thereon so as to form vertical transistors.

Figure 5A:
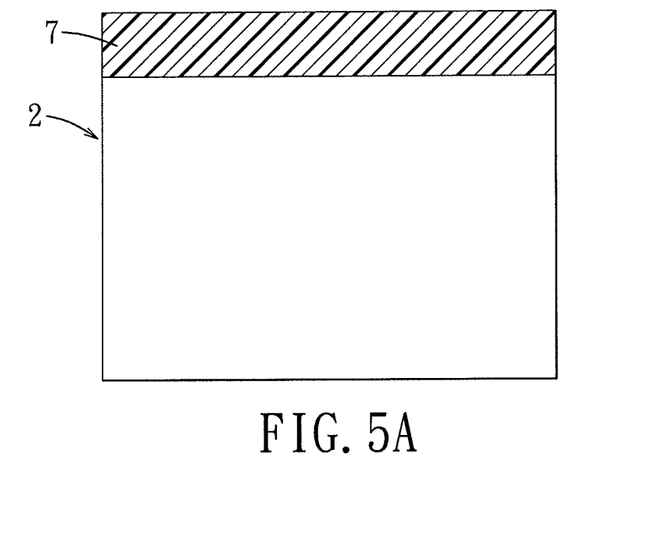
FIG. 5A to 5L are schematic views to illustrate consecutive steps of the preferred embodiment of a method of making the semiconductor device according to the present invention.
Figure 5B:
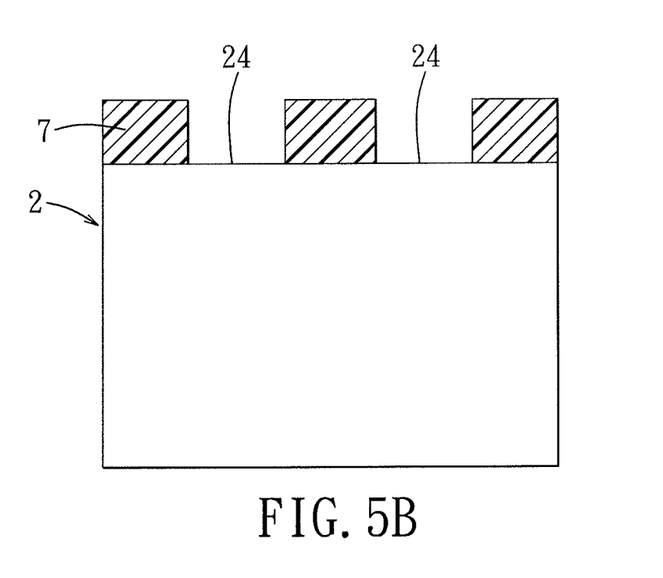
Figure 5C:
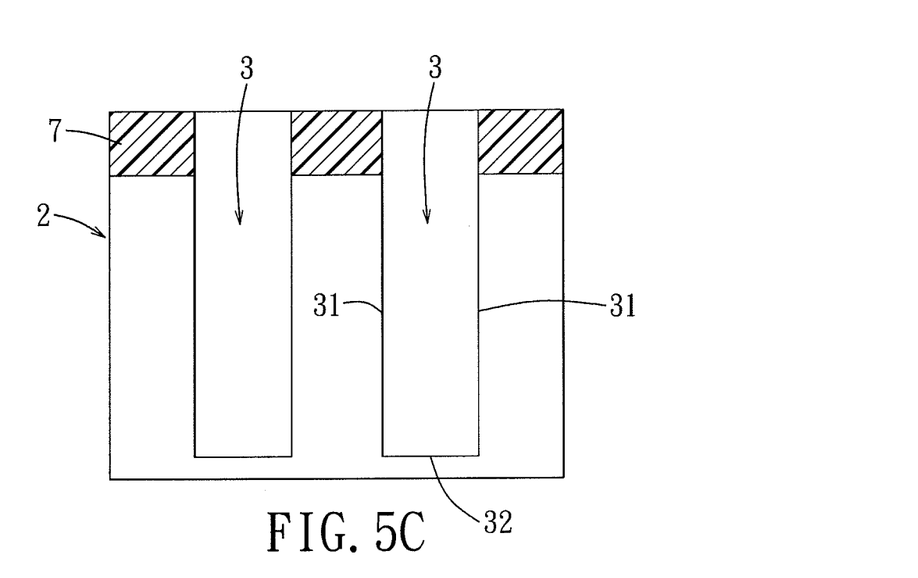
Figure 5D:
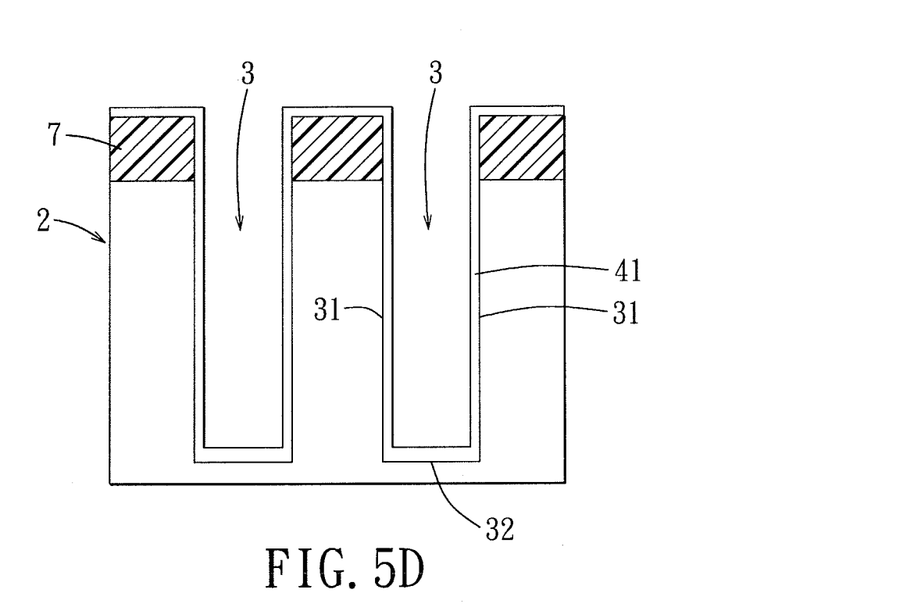
Figure 5E:
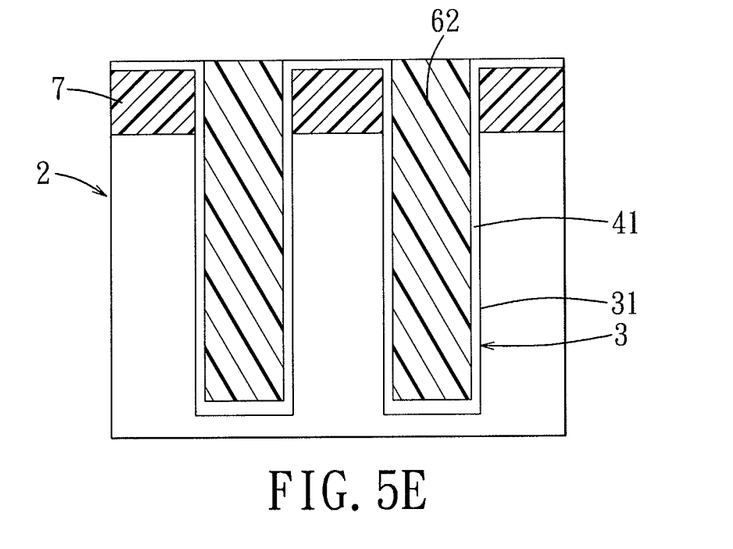
Figure 5F:
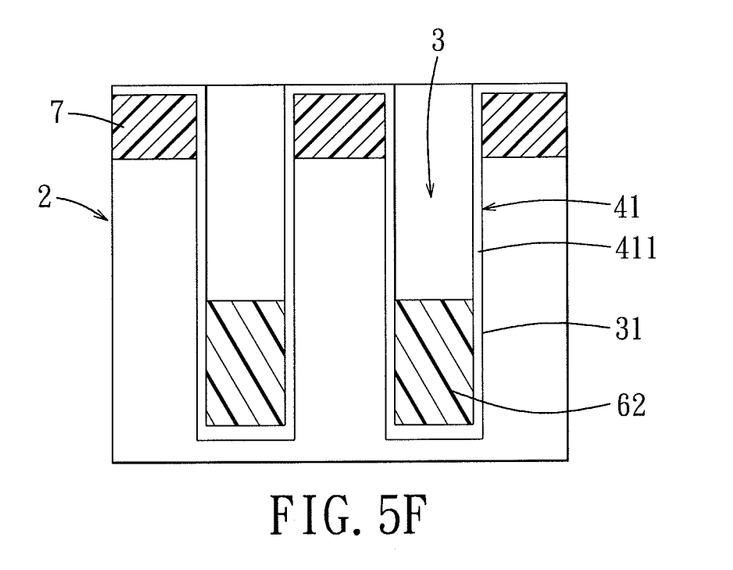
Figure 5G:
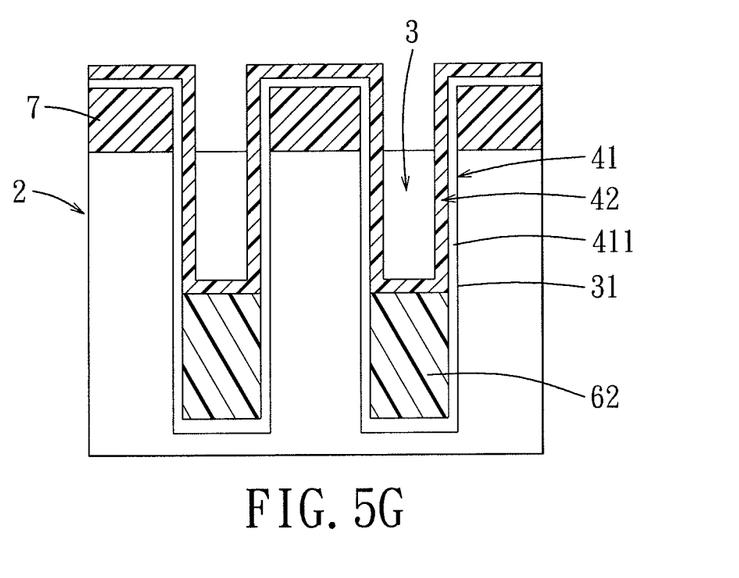
Figure 5H:
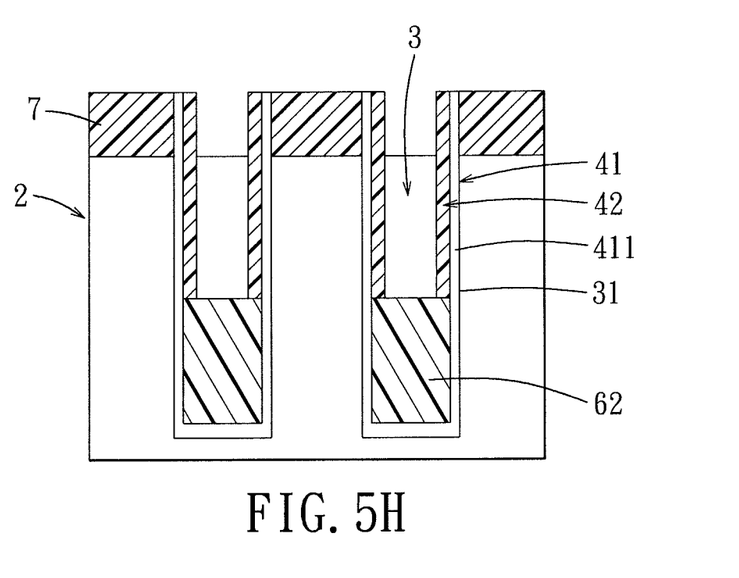
Figure 5I:
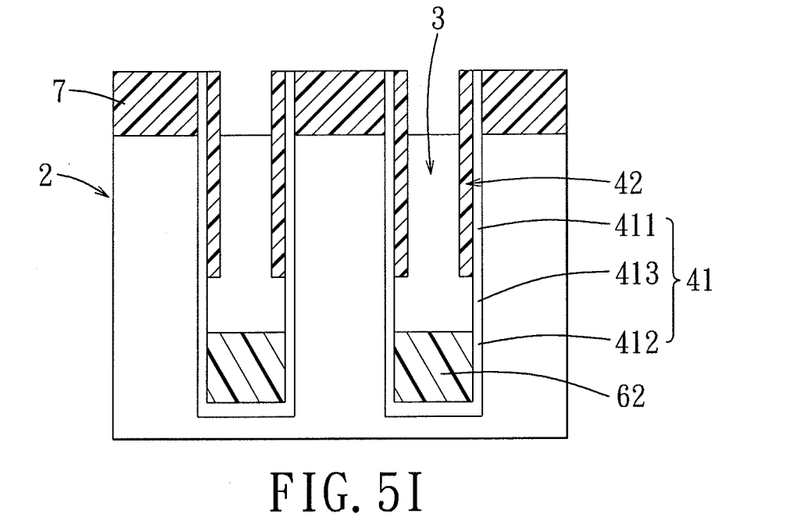
Figure 5J:
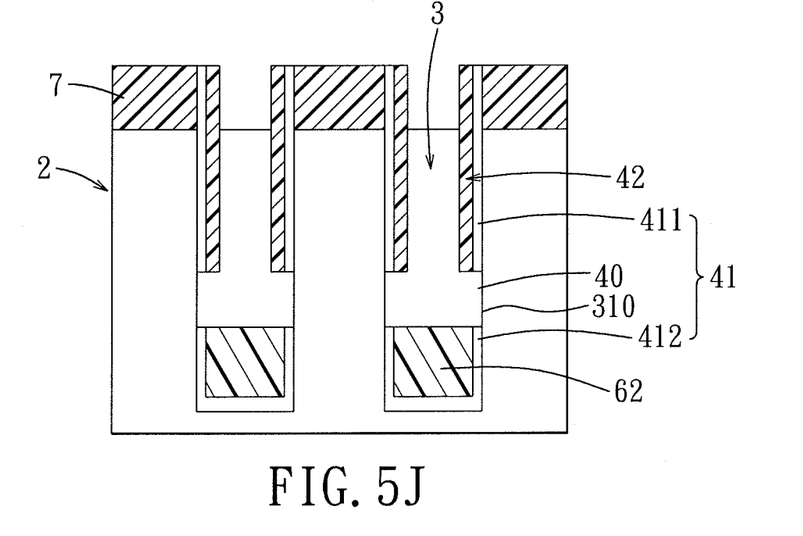
Figure 5K:
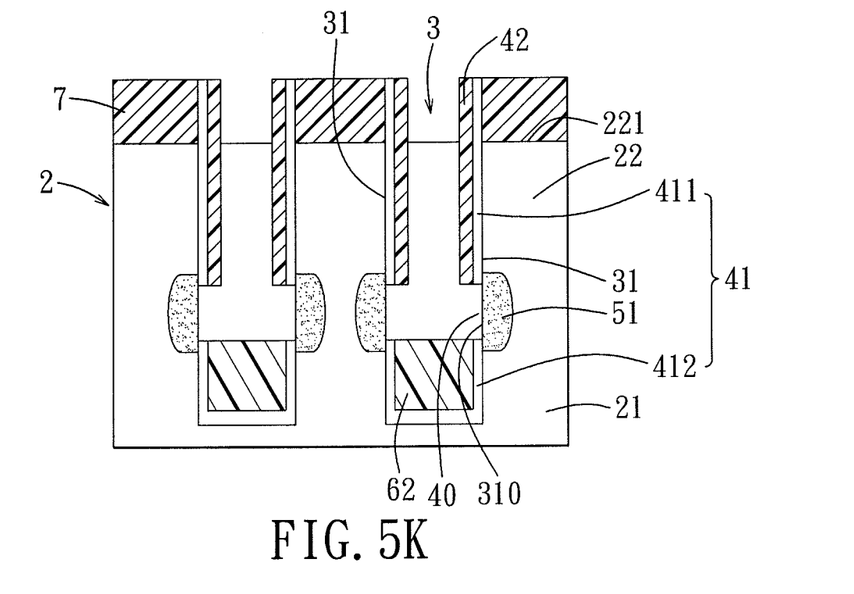
Figure 5L:
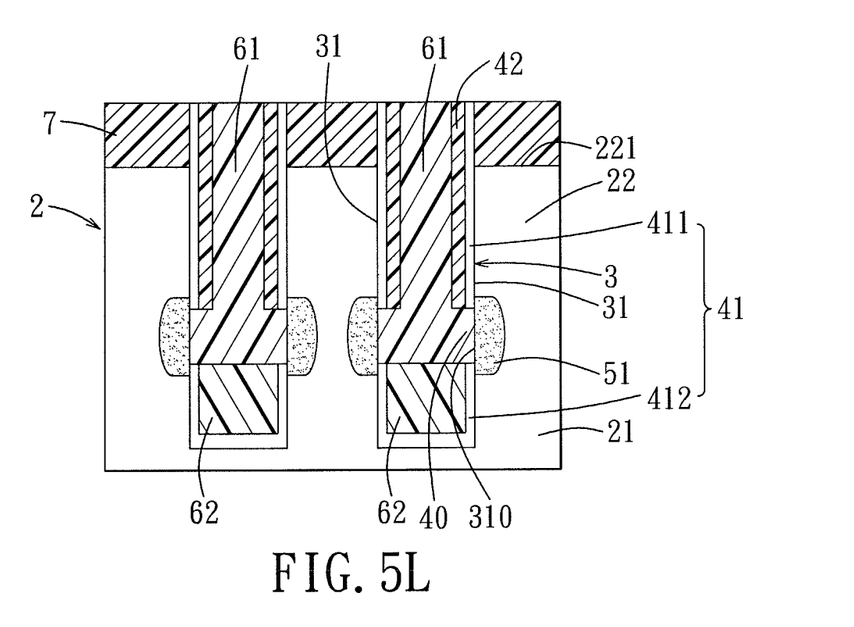

It is noted that when the first insulative liner layer 41 and the bit-controlling material 62 are made from the same material, the step of removing the top portion of the bit-controlling material 62 (as shown in FIG. 5I) and the step of removing the intermediate segment 413 of the first insulative liner layer 41 (as shown in FIG. 5J) can be combined into a single step.

Preferably, the hard mask layer 7 is made from a material selected from SiN and $SiO_2$.

Preferably, the bit-controlling material 62 is selected from SiN, $SiO_2$, poly-Si and photoresist.

Preferably, the first insulative liner layer 41 is made from a material selected from SiN, $SiO_2$, SiON, and combinations thereof.

Preferably, the second insulative liner layer 42 is made from a material selected from SiN, SiON, and $SiO_2$.

Preferably, the insulative isolation material 61 is selected from $SiO_2$ and SiN.

Formation of the diffusion buried bit lines 51 can be conducted using plasma doping techniques, or phosphine annealing techniques, or by forming a dopant-doped poly-Si layer on the bit-forming surface 310 through deposition techniques, followed by annealing.

Figure 6A:
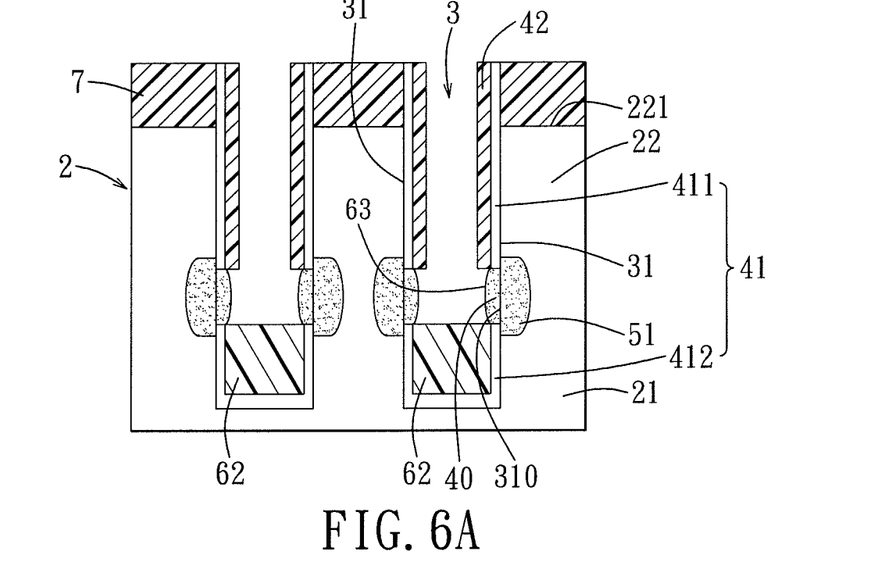
FIGS. 6A and 6B are schematic views illustrating a modified method of making the semiconductor device according to the present invention.
Figure 6B:
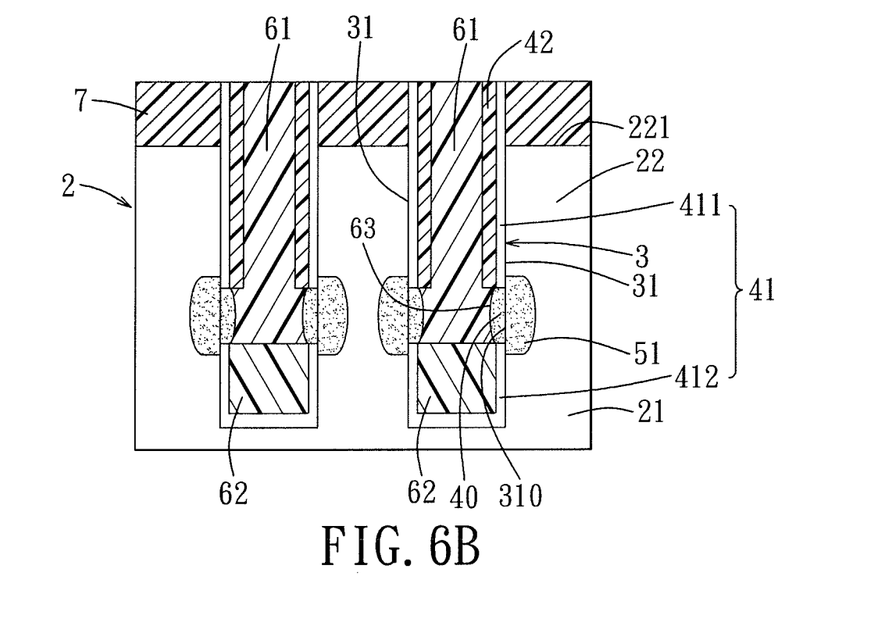

Referring to FIGS. 6A and 6B, in combination with FIGS. 5A to 5K, the method of this invention can be modified by further forming a conductive silicide layer 63 of a silicide of a refractory metal on the bit-forming surface 310 of each of the trench side walls 31 (see FIG. 6A) after formation of the diffusion buried bit lines 51, followed by filling the insulative isolation material 61 in each of the trenches 3 (see FIG. 6B). Formation of the silicide layer 63 is conducted by depositing the refractory metal on the bit-forming surface, and may be followed by thermal treatment, depending on the refractory metal used.

The method of this invention is advantageous in that, by removing an upper portion of the bit-controlling material 62 (see FIG. 5F), a top end of the bit-forming surface 310 is defined, and by removing a top portion of the bit-controlling material (see FIG. 5I), a bottom end of the bit-forming surface 310 is defined. As such, the height and the position of each diffusion buried bit line 51 can be easily controlled, which, in turn, facilitates resistance control of each diffusion buried bit line 51.

Since formation of the buried bit lines 51 is conducted using dopant diffusion techniques, the aforementioned drawbacks of the conventional method due to the use of ion implantation techniques can be alleviated or eliminated.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method for making a semiconductor device, comprising:
   (a) forming a plurality of trenches in a substrate;
   (b) forming a first insulative liner layer on two opposing trench side walls of each of the trenches;
   (c) partially covering the first insulative liner layer with a bit-controlling material such that only an upper segment of the first insulative liner layer on each of the trench side walls is uncovered by the bit-controlling material;
   (d) forming a second insulative liner layer on the upper segment of the first insulative liner layer on each of the trench side walls, the second insulative liner layer being made from a material different from those of the first insulative liner layer and the bit-controlling material;
   (e) removing atop portion of the bit-controlling material and an intermediate segment of the first insulative liner layer that is covered by the top portion of the bit-controlling material so as to uncover a bit-forming surface of each of the trench side walls; and
   (f) diffusing a dopant into the substrate through the bit-forming surface to form a buried bit line that extends inwardly from the bit-forming surface into each of the trench side walls.

2. The method of claim 1, wherein step (e) is conducted by first removing the top portion of the bit-controlling material so as to expose the intermediate segment of the first insulative liner layer on each of the trench side walls, followed by removing the intermediate segment of the first insulative liner layer on each of the trench side walls so as to uncover the bit-forming surface of each of the trench side walls.

3. The method of claim 1, wherein step (c) is conducted by filling each of the trenches with the bit-controlling material that covers entirely the first insulative liner layer on each of the trench side walls, followed by removing an upper portion of the bit-controlling material so as to expose the upper segment of the first insulative liner layer on each of the trench side walls.

4. The method of claim 1, wherein step (d) is conducted by depositing the second insulative liner layer on a top end of the bit-controlling material and on the upper segment of the first insulative liner layer on each of the trench side walls, followed by removing a bottom portion of the second insulative liner layer to expose the top end of the bit-controlling material.

5. The method of claim 1, wherein the bit-controlling material is selected from SiN, $SiO_2$, poly-Si and photoresist.

6. The method of claim 1, wherein the first insulative liner layer is made from a material selected from SiN, $SiO_2$, SiON, and combinations thereof.

7. The method of claim 1, wherein the second insulative liner layer is made from a material selected from SiN, SiON, and $SiO_2$.

8. The method of claim 1, wherein step (f) is conducted using plasma doping techniques.

9. The method of claim 1, wherein step (f) is conducted by forming a dopant-doped poly-Si layer on the bit-forming surface through deposition techniques, followed by annealing.

10. The method of claim 1, wherein step (f) is conducted using phosphine annealing techniques.

11. The method of claim 1, wherein the substrate is a silicon wafer.

12. The method of claim 11, further comprising depositing a refractory metal on the bit-forming surface so as to form a conductive silicide layer on the bit-forming surface of each of the trench side walls after step (f).

13. The method of claim 12, wherein the refractory metal is selected from titanium, tungsten, nickel and cobalt.

14. The method of claim 1, further comprising filling an insulative isolation material in each of the trenches after step (f) to cover the bit-forming surface of each of the trench side walls.

* * * * *